(12) United States Patent
Goto

(10) Patent No.: US 7,764,109 B2
(45) Date of Patent: Jul. 27, 2010

(54) SEMICONDUCTOR DEVICE AND VOLTAGE DIVIDER CIRCUIT

(75) Inventor: Tomoyuki Goto, Kawasaki (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/364,744

(22) Filed: Feb. 3, 2009

(65) Prior Publication Data

US 2009/0212749 A1     Aug. 27, 2009

(30) Foreign Application Priority Data

Feb. 26, 2008 (JP) ............................. 2008-043966

(51) Int. Cl.
*G05F 1/10* (2006.01)

(52) U.S. Cl. ..................... 327/538; 327/530

(58) Field of Classification Search .............. None
See application file for complete search history.

(56) References Cited

U.S. PATENT DOCUMENTS

| | | | | |
|---|---|---|---|---|
| 6,013,940 | A * | 1/2000 | Harada et al. ............... | 257/538 |
| 6,060,760 | A * | 5/2000 | Tan ............................. | 257/536 |
| 6,725,436 | B2 * | 4/2004 | Koike et al. ..................... | 716/8 |
| 6,727,556 | B2 * | 4/2004 | Shiiki et al. .................. | 257/358 |
| 6,904,583 | B2 * | 6/2005 | Hirohata ...................... | 716/11 |
| 6,911,896 | B2 * | 6/2005 | Nicholson et al. ........... | 338/260 |
| 7,053,751 | B2 * | 5/2006 | Itoh ............................. | 338/333 |
| 7,449,783 | B2 * | 11/2008 | Beach et al. ................. | 257/774 |
| 7,589,581 | B2 * | 9/2009 | Kim ............................. | 327/525 |
| 7,592,855 | B2 * | 9/2009 | Kamatani .................... | 327/525 |
| 2007/0030614 | A1 | 2/2007 | Yano et al. .................... | 361/92 |
| 2007/0236268 | A1* | 10/2007 | McClure ...................... | 327/244 |
| 2009/0262053 | A1* | 10/2009 | Wei et al. ...................... | 345/87 |
| 2009/0295462 | A1* | 12/2009 | Itoh ............................. | 327/525 |

FOREIGN PATENT DOCUMENTS

| | | | |
|---|---|---|---|
| JP | 58-100449 | | 6/1983 |
| JP | 11352160 | A * | 12/1999 |
| JP | 2000-294732 | | 10/2000 |
| JP | 3561394 | | 6/2004 |
| JP | 2005-168159 | | 6/2005 |
| JP | 2005-168160 | | 6/2005 |
| JP | 3710920 | | 8/2005 |
| JP | 2006-262574 | | 9/2006 |
| JP | 3887260 | | 12/2006 |

(Continued)

*Primary Examiner*—Lincoln Donovan
*Assistant Examiner*—Thomas J Hiltunen
(74) *Attorney, Agent, or Firm*—Cooper & Dunham LLP

(57) ABSTRACT

A semiconductor device includes a resistance layout area that disposes multiple unit resistors, and a voltage divider circuit that divides a voltage applied to a series circuit and has the series circuit including a first resistance element, a second resistance element, some trimming resistance element connected in series, and some trimming fuse respectively connected in parallel with the trimming resistance element, in the circuit, the unit resistors belonging to each of three main resistance elements formed by the first resistance element, the second resistance element, and a highest trimming resistance element whose resistance value is highest among the trimming resistance elements are divided into multiple blocks each including a predetermined number of the unit resistors, and the multiple groups each including one block of each of the three main resistance elements adjacently arranged are formed, and the groups arranged close to a center portion of the resistance layout area.

8 Claims, 3 Drawing Sheets

FOREIGN PATENT DOCUMENTS

| | | |
|---|---|---|
| JP | 3899109 | 1/2007 |
| JP | 2007-28898 | 2/2007 |
| JP | 2007-49796 | 2/2007 |
| JP | 3948435 | 4/2007 |
| JP | 4049184 | 12/2007 |

* cited by examiner

FIG. 4
FIG. 5
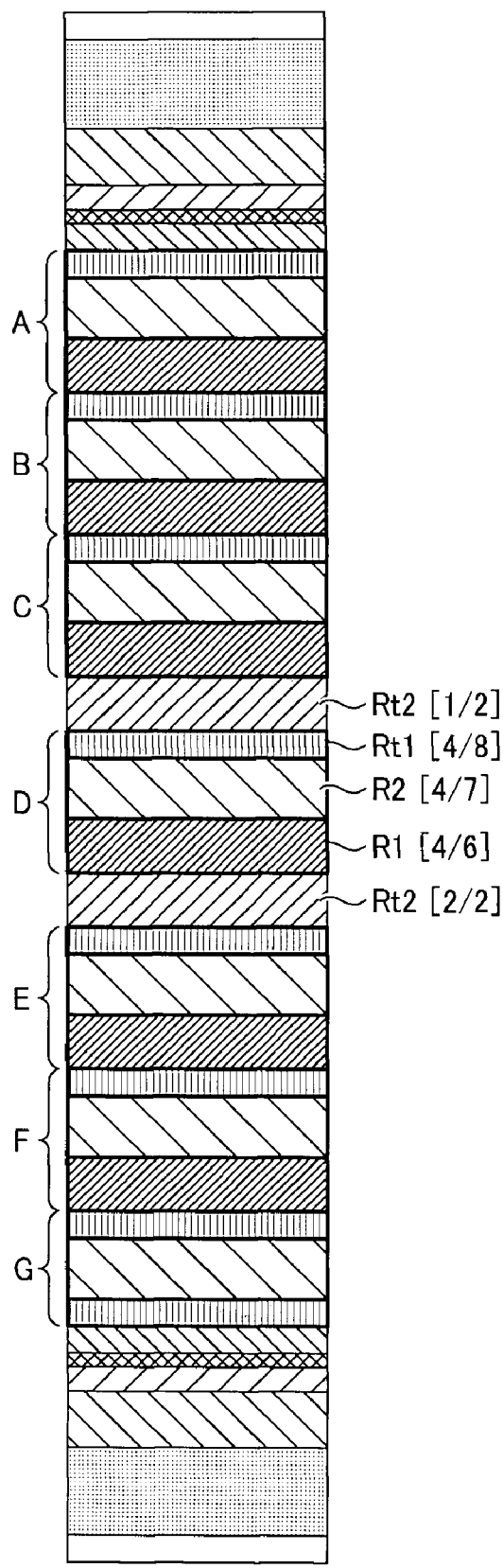
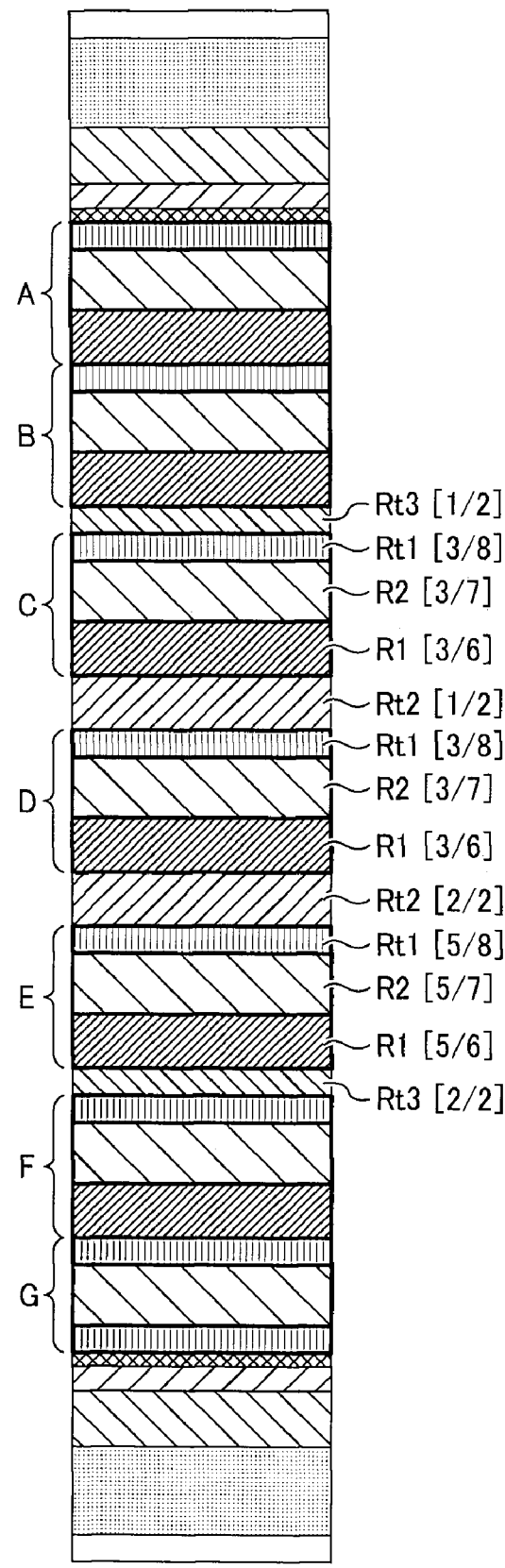

SEMICONDUCTOR DEVICE AND VOLTAGE DIVIDER CIRCUIT

CROSS-REFERENCE TO RELATED APPLICATIONS

This patent specification claims priority from Japanese Patent Application No. 2008-043966, filed on Feb. 26, 2008 in the Japan Patent Office, the entire contents of which are hereby incorporated by reference herein.

BACKGROUND OF THE INVENTION

1. Field of the Invention

The present invention relates to a semiconductor device including a resistance voltage divider circuit that divides voltages using resistors and is used for detecting an output voltage of a constant voltage circuit for a whole category of electronic equipment high precision protectors for cell phones and other devices that use on-board Li+/Li polymer batteries, and more particularly, a semiconductor device including a resistance voltage divider circuit that is equipped with trimming resistors.

2. Discussion of the Background

In order to output a divided voltage accurately, in a resistance divider voltage circuit used for detecting an output voltage of a constant voltage circuit it is important that precision of resistance ratio of resistors forming the voltage divider circuit be higher than that of an absolute resistance value.

In general, resistors formed in semiconductor devices do not necessarily have an identical resistance value even though they have an identical configuration, due to variations in manufacturing processes when they are positioned separately in the semiconductor chip. Further, the resistance value of the resistors formed in the semiconductor device can also vary because they can receive stress differently during the molding process.

Therefore, the resistors used in the voltage divider circuit are usually formed in groups in a resistance layout area in the semiconductor device. However, those resistance values can vary depending on location, such as a center portion, end portions, and boundary portions, even though the resistors have an identical configuration.

In order to solve the problem described above, in one known configuration each resistance element forming a voltage divider circuit is divided into multiple unit resistors, and the unit resistors belonging to one resistance element are alternated with unit resistors belonging to another resistance element.

However, in the above-mentioned configuration, wiring is complicated since the unit resistors belonging to one resistance element are arranged alternately with the unit resistors belonging to another resistance element.

As an additional complication, because the number of the unit resistors in each resistance element needs to be the same or substantially the same, some problems arise. For example, the number of the unit resistors can be increased, and accordingly the resistance layout area can be larger, and, if the resistance values of the resistance elements are extremely different, the unit resistors thereof cannot be arranged alternately.

Moreover, because resistance elements that require high-precision are arranged alternately with resistance elements that do not require high precision, when the resistance elements forming the voltage divider circuit increase in number, improving the precision of the resistance elements that require high precision is difficult.

In another known configuration, among resistors forming a divider circuit, multiple resistors that require relatively high precision are arranged adjacently in a center portion of a layout area, and other resistors are arranged outside those resistors.

However, although the resistors can be arranged irrespective of the resistance value and wiring is simple, a precision of the resistance ratio is lower than the former configuration.

SUMMARY OF THE INVENTION

In view of the foregoing, one illustrative embodiment of the present invention provides a semiconductor device including a resistance layout area laid out on a semiconductor chip, and a voltage divider circuit that divides a voltage applied to a series circuit and outputs a divided voltage. The voltage divider circuit includes the series circuit that is provided with a first resistance element, a second resistance element, and at least one trimming resistance element connected in series, and at least one trimming fuse formed outside the resistance layout area, respectively connected in parallel with the trimming resistance element.

In the voltage divider circuit, the unit resistors belonging to each of three main resistance elements formed by the first resistance element, the second resistance element, and a highest trimming resistance element whose resistance value is highest among the at least one trimming resistance element, are divided into multiple blocks each including a predetermined number of blocks.

Further, multiple groups each including one block of each of the three main resistance elements adjacently arranged are formed, so that the groups are arranged close to a center portion of the resistance layout area.

Another illustrative embodiment of the present invention provides a voltage divider circuit including a series circuit formed in a resistance layout area disposing multiple unit resistors, to which a voltage is applied. The series circuit includes a first resistance element, a second resistance element, and at least one trimming resistance element, connected in series, and at least one trimming fuse formed outside the resistance layout area, respectively connected in parallel with the at least one trimming resistance element.

In the voltage divider circuit, the unit resistors belonging to each of three main resistance elements formed by the first resistance element, the second resistance element, and a highest trimming resistance element whose resistance value is highest among the at least one trimming resistance element, are divided into multiple blocks each including a predetermined number of the unit resistors.

Moreover, multiple groups each including one block of each of the three main resistance elements adjacently arranged are formed, such that the groups are arranged close to a center portion of the resistance layout area.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 4 is a layout chart illustrating another example of the layout of each resistance element in the divider circuit 1 shown in FIG. 1; and FIG. 5 is a layout chart illustrating another example of the layout of each resistance element in the divider circuit 1 shown in FIG. 1.

DETAILED DESCRIPTION OF PREFERRED EMBODIMENTS

Figure 1:
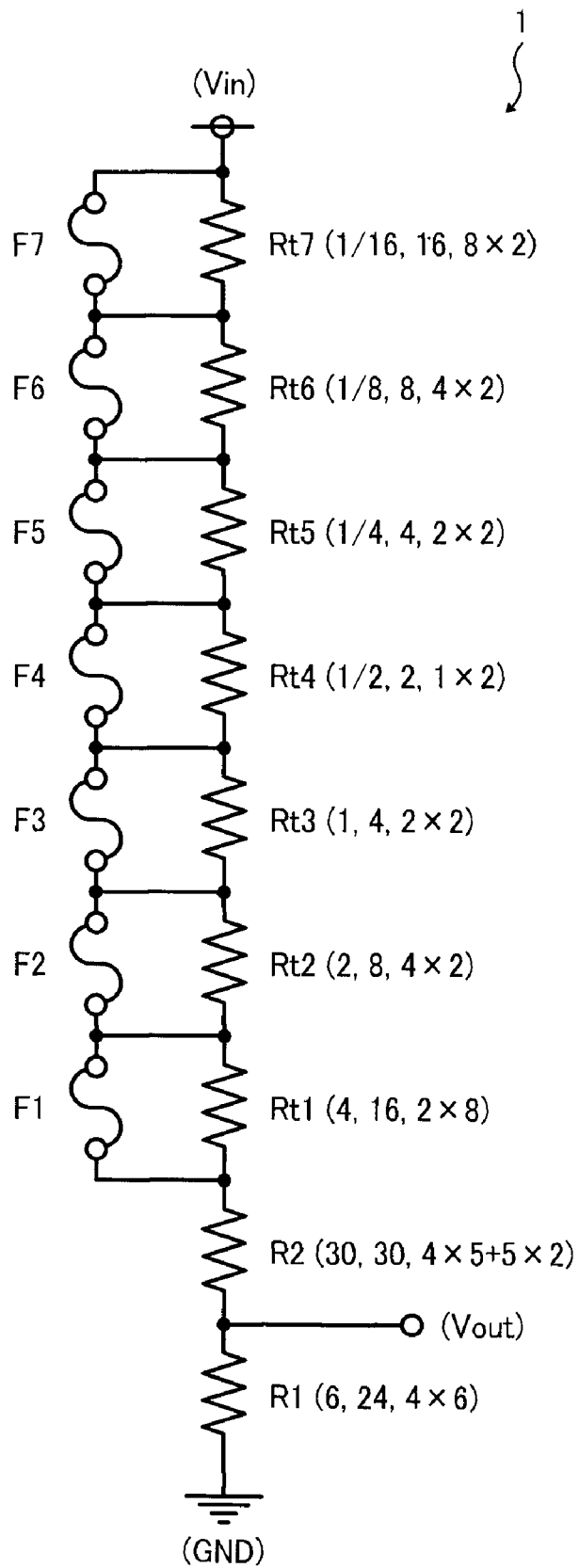
FIG. 1 is an example of circuitry of a voltage divider circuit included in a semiconductor device according to one illustrative embodiment of the present invention.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve a similar result.

Referring now to the drawings, wherein like reference numerals designate identical or corresponding parts throughout the several views thereof, particularly to FIG. 1, a voltage divider circuit included in a semiconductor device according to an example embodiment of the present invention is described below.

FIG. 1 shows an example of circuitry of the voltage divider circuit included in the semiconductor device according to the present embodiment.

Referring to FIG. 1, a voltage divider circuit 1 is built into a semiconductor device formed by a semiconductor integrated circuit (IC) having predetermined functions. In the voltage divider circuit 1, an input voltage Vin is divided and outputted as a divided voltage Vout.

The voltage divider circuit 1 includes main resistance elements R1 and R2, trimming fuses F1 through F7, and trimming resistance elements Rt1 through Rt7 connected in parallel to the trimming fuses F1 through F7, respectively. It is to be noted that the resistance element R1 serves as a first resistance element, and the resistance element R2 serves as a second resistance element.

The trimming resistance elements Rt1 through Rt7 are connected in series between the input voltage Vin and a terminal of the resistance element R2. The trimming fuses F1 through F7 are arranged in parallel to the trimming resistance elements Rt1 through Rt7, respectively. The resistance element R1 is connected between the other terminal of the resistance element R2 and a ground GND, and the divide voltage Vout is output from a junction node between the resistance elements R1 and R2.

In the configuration described above, all of the resistance elements shown in FIG. 1 respectively consist of at least two unit resistors and are formed in a resistance layout area.

In FIG. 1, numerals and a multiplication expression in parentheses next to reference characters indicating each resistance element represent a ratio to a resistance value of the unit resistor, the number of the unit resistors used for obtaining that resistance value, and the number of blocks of the unit resistors forming that resistance element and the number of unit resistors included in one block, respectively.

For example, notation in parentheses of the resistance element R1 is (6, 24, 4×6). The first numeral from the left, 6, means that the resistance value of the resistance element R1 is six times as high as the resistance value of the unit resistor. The second numeral from the left, 24, means that the resistance element R1 includes 24 unit resistors. Further, the multiplication expression 4×6 means that the resistance element R1 is formed by six blocks each of which consists of four unit resistors.

Similarly, a notation in parentheses of the resistance element R2 is (30, 30, 4×5+5×2). That is, the resistance value of the resistance element R2 is 30 times as high as the resistance value of the unit resistor, and the resistance element R1 includes 30 unit resistors. Further, the expression 4×5+5×2 means that the resistance element R2 includes five blocks each of which consists of four unit resistors and two blocks each of which consists of five unit resistors.

Among the trimming resistance elements Rt1 through Rt7, the trimming resistance element Rt1 serves as a highest trimming resistance element that has a highest resistance value and the trimming resistance element Rt7 has a lowest resistance value. Additionally, relations among the resistance values of the resistance elements Rt1 through Rt7 are described below.

As the numeric subscript of the reference character increases, the resistance value decreases exponentially. For example, the resistance value of the trimming resistance element Rt1 is half the resistance value of the trimming resistance element Rt2.

It is to be noted that although in FIG. 1 the trimming resistance elements Rt1 through Rt7 are disposed in descending order of the resistance value in series between the resistance element R2 and the input voltage Vin for ease of explanation, such an arrangement is just one example thereof and the present invention is not limited thereto. Thus, any layout of the resistance elements can be adopted as long as the trimming resistance elements Rt1 through Rt7 and the resistance elements R1 and R2 are connected in series.

Further, the series circuit of trimming resistance elements Rt1 through Rt7 can be connected with the side of the ground GND.

Figure 2:
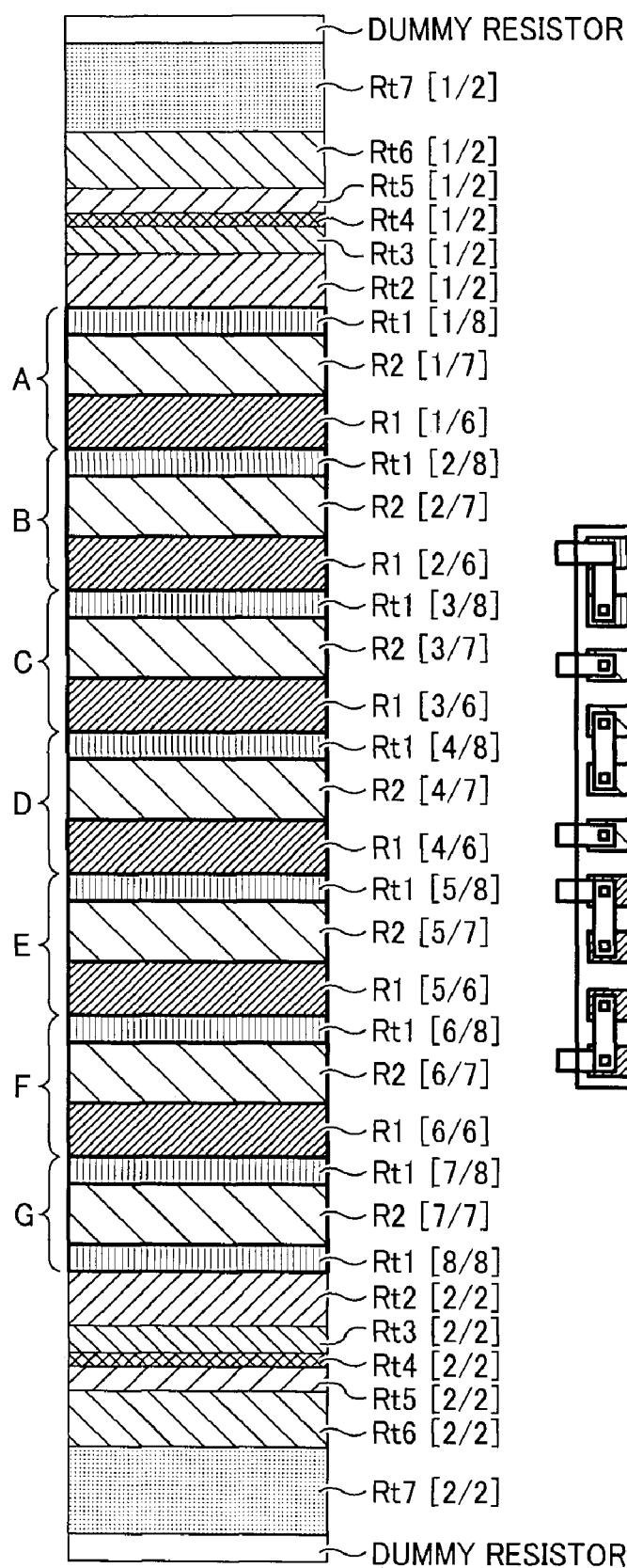
FIG. 2 is a layout chart illustrating an example of a layout of each resistance element in the voltage divider circuit 1 shown in FIG. 1.

FIG. 2 is a layout chart illustrating an example of a layout of each resistance element in the voltage divider circuit 1 shown in FIG. 1. In FIG. 2, each resistance element divided into multiple blocks is arranged in a resistance layout area on a semiconductor chip. In FIG. 2, groups A through G include blocks of different resistance elements.

In fractional expressions in square brackets to the right of the subscript of each resistance element shows, the denominator means the number of the blocks into which the resistance element is divided and the numerator means that the ordinal number of the group to which that block of the resistance element belongs. Additionally, the trimming fuses F1 through F7 are not shown in figures because they are formed outside the layout area.

Figure 3:
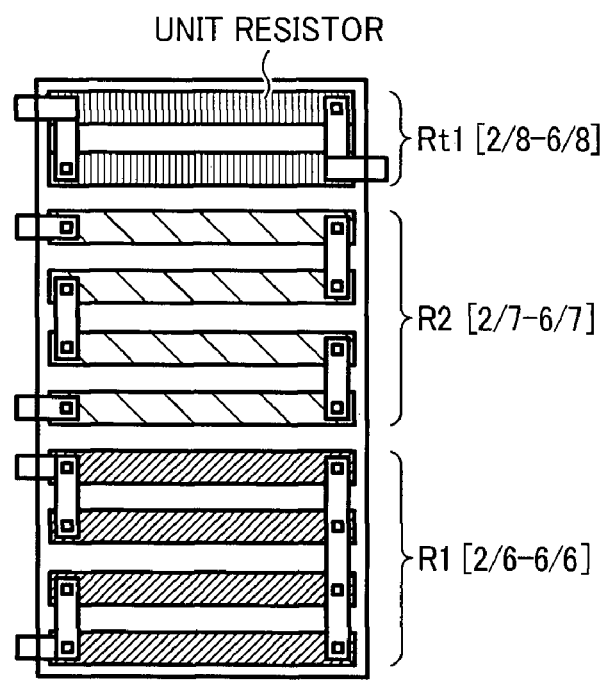
FIG. 3 shows a detailed diagram illustrating one of groups B through F in a center position of the layout shown in FIG. 2.

FIG. 3 shows a detailed diagram illustrating one of the groups B through F in a center position in FIG. 2. The resistance ratio between the resistance element R1 and R2 requires the highest precision of the resistance ratio in the voltage divider circuit 1. In the next place, the resistance element whose resistance value is highest among the trimming resistance elements is the trimming resistance element Rt1. Thus, the main resistance elements R1 and R2, and the trimming resistance element Rt1 are arranged in the center portion of the resistance layout area.

Further, as a method of arrangement, the multiple unit resistors forming each of these three main resistance elements are divided into the same or substantially the same number of blocks.

In FIG. 3, the resistance element R1 is divided into six groups, the resistance element R2 is divided into seven groups, the trimming resistance element Rt1 is divided into eight groups.

The reason why the number of the division of the resistance element R1 is slightly fewer is described below.

Referring to FIG. 3, in the resistance element R1, one block is formed by four unit resistors, and the four unit resistors are divided into two unit resistor pairs. In the unit resistor pair, the unit resistors are connected in parallel to each other, and the unit resistor pairs are connected in series. Thus, to simplify the wiring it is preferable that the resistance element R1 be divided into multiple blocks each formed by four unit resistors.

Therefore, by considering the above-described condition, the resistance elements are divided into identical numbers or nearly identical numbers to the extent possible.

Referring to FIG. 3, the unit resistors forming each divided resistance element (block) are arranged adjacently per resistance element and connected with other divided resistance elements. In other words, the block of the resistance element R1 is formed by two unit resistor pairs connected in series, and each unit resistor pair consists of two unit resistors connected in parallel.

A divided resistance element R2 is formed by four unit resistors connected in series.

A divided trimming resistance element Rt1 is formed by two unit resistors connected in parallel.

In this way, the groups in which the blocks of the unit resistors, belonging to different resistance elements are arranged adjacently are formed as fundamental units. In FIG. 2, these groups are represented by reference characters A through G and arranged adjacently in the center portion of the layout area.

The unit resistors belonging to each of the trimming resistance elements Rt2 through Rt7 are divided into two blocks. In this case, as the resistance values increase in the trimming resistance elements, the trimming resistance elements are arranged closer to the center portion.

Further, on both outmost of the layout area, dummy resistance elements are located respectively.

By configuring the resistant elements as described above, compared with a case in which unit resistors belonging to one resistance element are arranged alternately with the unit resistors belonging to another resistance element, wiring of the unit resistors can be drastically simplify. Additionally, because the three main resistance elements are mixed moderately, the precision of the resistance ratio can be improved.

Further, by arranging the resistance elements whose precision of resistance ratio can be relatively low, such as those used for low-order bits of the trimming resistor, outside of the three main resistance elements, a decline in the precision of the resistance ratio of the three main resistance elements can be prevented.

Further, as the precision of resistance ratio that the resistance elements require increases, these resistance elements are arranged in a portion closer to the center portion, thus preventing the precision of the trimming from declining.

Moreover, because dummy resistance elements are provided, the resistance elements that are used actually are not located in highest fluctuation areas in the layout area. Therefore, the precision of the resistance ratio can be improved.

FIG. 4 is a layout chart illustrating another example of the layout of each resistance element in the divider circuit 1 shown in FIG. 1. In the layout chart shown in FIG. 4, precision of the resistance ratio of the trimming resistance elements Rt2 can be improved.

Referring to FIG. 4, the trimming resistance element Rt2 is divided into two blocks, and the blocks of the divided resistance elements Rt2 are arranged respectively above and beneath the group D of the three main resistance elements. Thus, precision of the resistance ratio between the trimming resistance element Rt2 and each of the three main resistance elements can be improved.

However, precision of the resistance ratio among the three main resistance elements is slightly lower than the example shown in FIG. 2.

Therefore, by comprehensively considering the resistance value of each resistance element and required precision of divided voltage, it is necessary to judge which of the layouts shown in FIG. 2 and FIG. 4 is more effective for a given application.

FIG. 5 is a layout chart illustrating another example of the layout of each resistance element in the divider circuit 1 shown in FIG. 1. Elements identical or similar to those of FIG. 2 are represented by the same reference numerals.

In the layout chart shown in FIG. 5, precision of the resistance ratio of the trimming resistance elements Rt3 in addition to that of the resistance elements Rt2 can be improved.

Referring to FIG. 5, the trimming resistance element Rt2 and Rt3 are divided respectively into two blocks, and the blocks of the resistors Rt2 are arranged respectively above and below the group D of the three main resistance elements, the blocks of the resistors Rt3 are located outsides the groups C and E. Thus, precision of the resistance ratio between the trimming resistance element Rt3 and the three main resistance elements can be improved.

However, precision of the resistance ratio among the three main resistance elements is further lower than the example shown in FIG. 4.

Therefore, by comprehensively considering the resistance value of each resistance element and required precision of the divided voltage, it is necessary to judge which of the layouts shown in FIG. 2, FIG. 4 and FIG. 5 is more effective for a given application.

It is to be noted that although in FIG. 4 and FIG. 5 the trimming resistance elements Rt2 and Rt3 are respectively divided into two blocks and are arranged on both sides of the center portion of the layout area, alternatively, when the number of the unit resistors forming the resistance elements Rt2 and Rt3 is larger, the number of divisions can be any even number greater than 2, and these unit resistors can be arranged symmetrically among the main resistance elements.

The description above concerns the examples in which the circuit includes the trimming resistance elements Rt1 through Rt7, it is just one example, and the present invention is not limited to the above-described embodiment, that is, the invention can be adopted to the circuit that includes at least one trimming resistance element.

Numerous additional modifications and variations are possible in light of the above teachings. It is therefore to be understood that, within the scope of the appended claims, the disclosure of this patent specification may be practiced otherwise than as specifically described herein.

What is claimed is:

1. A semiconductor device comprising:
 a resistance layout area configured to lay out a plurality of unit resistors on a semiconductor chip; and
 a voltage divider circuit formed in the resistance layout area, to divide a voltage applied to a series circuit and output a divided voltage,
 the voltage divider circuit comprising:

the series circuit including a first resistance element, a second resistance element, and at least one trimming resistance element connected in series; and at least one trimming fuse formed outside the resistance layout area, respectively connected in parallel with the at least one trimming resistance element, wherein the unit resistors belonging to each of three main resistance elements formed by the first resistance element, the second resistance element, and a highest trimming resistance element whose resistance value is highest among the at least one trimming resistance element are divided into multiple blocks each including a predetermined number of the unit resistors, wherein multiple groups each including one block of each of the three main resistance elements adjacently arranged are formed, and the groups are arranged close to a center portion of the resistance layout area.

2. The semiconductor device according to clam 1, wherein, when the voltage divider circuit includes multiple trimming resistance elements, the unit resistors belonging to each of the trimming resistance elements except the highest trimming resistance element are divided into two blocks and arranged symmetrically on both sides of the three main resistance elements.

3. The semiconductor device according to claim 2, wherein the blocks belonging to the trimming resistance elements except the highest trimming resistance element are arranged on both sides of the three main resistance elements in descending order of resistance value starting from a position closer to the three main resistance elements.

4. The semiconductor device according to claim 2, wherein the blocks belonging to the trimming resistance elements except the highest trimming resistance element are disposed on both sides of the three main resistance elements in descending order of required precision of resistance ratio starting from a position closer to the three main resistance elements.

5. The semiconductor device according to claim 1, wherein, when the voltage divider circuit includes multiple trimming resistance elements, at least one resistance element that requires a resistance ratio of highest precision in the trimming resistance elements except the highest trimming resistance element is divided into an even number of blocks, and the blocks are arranged among the groups of the three main resistance elements.

6. The semiconductor device according to claim 5, wherein the blocks belonging to the resistance element that requires the resistance ratio of highest precision in the trimming resistance elements except the highest trimming resistance element are disposed symmetrically with respect to the center portion of the resistance layout area.

7. The semiconductor device according to claim 1, further comprising two dummy resistors provided on both end portions of the resistance layout area.

8. A voltage divider circuit comprising:
a series circuit formed in a resistance layout area disposing multiple unit resistors, to which a voltage is applied, the series circuit including a first resistance element, a second resistance element, and at least one trimming resistance element connected in series; and at least one trimming fuse formed outside the resistance layout area, respectively connected in parallel with the at least one trimming resistance element, wherein the unit resistors belonging to each of three main resistance elements formed by the first resistance element, the second resistance element, and a highest trimming resistance element whose resistance value is highest among the at least one trimming resistance element are divided into multiple, blocks each including a predetermined number of the unit resistors, wherein multiple groups each including one block of each of the three main resistance elements adjacently arranged are formed, and the groups are arranged close to a center portion of the resistance layout area.

* * * * *